(12) United States Patent
Lee

(10) Patent No.: US 6,773,536 B2
(45) Date of Patent: Aug. 10, 2004

(54) METHOD AND APPARATUS FOR BONDING PROTECTION FILM ONTO SILICON WAFER

(75) Inventor: Masahiro Lee, Aichi (JP)

(73) Assignee: Teikoku Taping System Co., Ltd., Aichi (JP)

( * ) Notice: Subject to any disclaimer, the term of this patent is extended or adjusted under 35 U.S.C. 154(b) by 22 days.

(21) Appl. No.: 10/238,882

(22) Filed: Sep. 11, 2002

(65) Prior Publication Data

US 2003/0062116 A1 Apr. 3, 2003

(30) Foreign Application Priority Data

Sep. 11, 2001 (JP) ........................................ 2001/275527

(51) Int. Cl.⁷ .................. B32B 31/18; B32B 31/20; B32B 35/00
(52) U.S. Cl. ................. 156/248; 156/249; 156/267; 156/289; 156/510; 156/537
(58) Field of Search ........................... 156/161, 230, 156/234, 238, 241, 247–250, 267, 289, 323, 344, 510, 537, 580, 584, 160; 83/31

(56) References Cited

U.S. PATENT DOCUMENTS 4,075,051 A * 2/1978 Brzozowski ............... 156/236
4,188,254 A * 2/1980 Hemperly, Jr. ............. 156/382
5,808,274 A * 9/1998 Lee ........................ 219/121.72

FOREIGN PATENT DOCUMENTS

JP          10-32179          2/1998

* cited by examiner

Primary Examiner—Richard Crispino
Assistant Examiner—Sing P. Chan
(74) Attorney, Agent, or Firm—Morgan Lewis & Bockius LLP

(57) ABSTRACT

Provided is a protection film bonding method and a protection film bonding apparatus that improves productivity for bonding the protection film onto one surface of a silicon wafer. A carrier film is separated from a three-layer film having a reinforcement film, and is provided on front and rear surfaces of a protection film, to provide a two-layer film. This two-layer film is bonded onto the front surface of the silicon wafer, the reinforcement film is removed from the two-layer film and the protection film is trimmed. An apparatus consists of a supply unit, separation and take-up unit that separates the carrier film from the three-layer film, an assigning and separation unit, a joint unit that joins the two-layer film onto the silicon wafer, and a peel-off unit, that removes the reinforcement film while separating it from the two-layer film.

14 Claims, 8 Drawing Sheets

METHOD AND APPARATUS FOR BONDING PROTECTION FILM ONTO SILICON WAFER

BACKGROUND OF THE INVENTION

1. Field of the Invention

The present invention relates to a method for bonding a protection film to one of the front and rear surfaces of a silicon wafer and an apparatus employed for the method.

2. Description of the Related Art

There are known hitherto, in a process of manufacturing a semiconductor device for an IC, an LSI or an ultra LSI, the step of bonding a protection film to the surface of a silicon wafer, and the step of cutting and polishing the rear surface of the silicon wafer obtained in the former step to make a finally obtained semiconductor device having a predetermined thickness. In the former step, as described in Japanese Patent Unexamined Application Publication No. 10-32179, a strip protection film is temporarily bonded onto a silicon wafer and then a part of the protection film which excessively extends outward of the outer periphery of the silicon wafer is cut off, i.e., so-called trimming is conducted.

However, following the recent higher integration of electronic equipment, demand for making semiconductor devices used in the equipment small in size and light in weight becomes greater and it becomes necessary to make the protection film thinner. For example, it is demanded that the thickness of a protection film which is conventionally, normally about 100 μm be decreased to about 15 μm. As a result, because the thinned protection film is low in physical properties, e.g., tensile strength, it is difficult to assign and bond only the protection film onto the surface of the silicon wafer neatly.

Considering this, the following protection film bonding method has been conventionally proposed. As shown in FIG. 14, a two-layer film H2 which has a reinforcement film 3 provided on the surface of a protection film 2, is assigned to a silicon wafer 1 from above, and then the two-layer film H2 is trimmed by a laser beam L along the peripheral edge of the silicon wafer 1. As shown in FIG. 15, the two-layer film H2 is joined to the surface of the silicon wafer 1 first and then the reinforcement film 3 is peeled off from the protection film 2 by a person skilled in the art, whereby the silicon wafer 1 the upper surface of which is protected only by the protection film 2 is obtained as shown in FIG. 16.

According to this method, a carrier film (not shown) is normally provided on the rear surface of the protection film 2 of the two-layer film H2. This three-layer film is designed so that the carrier film is peeled off from the protection film when the three-layer film is delivered close to the silicon wafer.

According to the above-stated conventional method, however, it is necessary to peel off one by one the reinforcement films from the protection films of silicon wafers after cutting off by the laser beam. This peel-off operation is laborious and even a person skilled in the art needs to take special care. Due to this, it is difficult to further improve productivity for a series of steps of bonding the protection film onto the silicon wafer.

SUMMARY OF THE INVENTION

The present invention has been achieved to solve the above-stated disadvantages. It is an object of the present invention to provide a method for bonding a protection film onto a silicon wafer using a three-layer film having a reinforcement film and a carrier film on front and rear surfaces of a protection film, respectively, and to provide an apparatus used for this method, capable of improving productivity for an operation for bonding the protection film onto the silicon wafer.

The invention will now be described following.

1. A method for bonding a protection film onto a silicon wafer using a three-layer film formed by providing a reinforcement film and a carrier film on a front surface and a rear surface of said protection film, respectively, said method comprising the steps of:

separating said carrier film from said three-layer film to provide a two-layer film;

bonding said protection film onto a front surface of said silicon wafer as said two-layer film;

peeling off said reinforcement film from said two-layer film bonded onto said front surface of said silicon wafer to leave only said protection film on said front surface of said silicon wafer; and cutting off said protection film along a peripheral edge of said silicon wafer using trimming means.

2. A method for bonding a protection film onto a silicon wafer according to claim 1, wherein after cutting off said protection film by said trimming means, a residual cutout film is collected.

3. A method for bonding a protection film onto a silicon wafer according to claim 1, wherein after said two-layer film is bonded onto said front surface of said silicon wafer, said two-layer film is cooled by cooling means and then said reinforcement film is peeled off from said two-layer film.

4. A method for bonding a protection film onto a silicon wafer according to claim 3, wherein said cooling means is cooled air flow injection means for injecting a cooled air flow to said silicon wafer.

5. A method for bonding a protection film onto a silicon wafer according to claim 1, wherein said trimming means is laser beam means for applying a laser beam.

6. An apparatus for bonding a protection film onto a silicon wafer using a three-layer film formed by providing a reinforcement film and a carrier film on a front surface and a rear surface of said protection film, respectively, said apparatus comprising:

supply means for supplying said three-layer film to table means on which said silicon wafer is mounted;

separation and take-up means for separating and taking up said carrier film from said three-layer film supplied by said supply means;

assigning and separation means for inducing a two-layer film obtained by separating said carrier film from said three-layer film onto said silicon wafer, and assigning said two-layer film onto said silicon wafer;

joint means for pushing said two-layer film assigned onto said silicon wafer on said silicon wafer, and joining said two-layer film onto said silicon wafer;

peel-off means for taking up said reinforcement film while peeling off said reinforcement film from said two-layer film joined onto said silicon wafer;

trimming means for trimming said protection film obtained by peeling off said reinforcement film from said two-layer film along a peripheral edge of said silicon wafer; and take-up means for taking up a cutout film remaining after said protection film is trimmed.

7. An apparatus for bonding a protection film onto a silicon wafer according to claim 6, wherein said assigning and separation means, said peel-off means and said joint means are set to be able to reciprocate in a traveling direction (X) in which said cutout film travels.

8. An apparatus for bonding a protection film onto a silicon wafer according to claim 6, wherein said peel-off means is arranged between said assigning and separation means and said joint means.

9. A method for bonding a protection film onto a silicon wafer according to claim 6, wherein said trimming means is laser beam means for applying a laser beam.

10. An apparatus for bonding a protection film onto a silicon wafer according to claim 6, wherein comprising cooling means for cooling said two-layer film joined onto said silicon wafer by said joint means.

11. An apparatus for bonding a protection film onto a silicon wafer according to claim 10, wherein said assigning and separation means, said peel-off means and said joint means are set to be able to reciprocate in a traveling direction (X) in which said cutout film travels.

12. An apparatus for bonding a protection film onto a silicon wafer according to claim 10, wherein said peel-off means is arranged between said assigning and separation means and said joint means.

13. A method for bonding a protection film onto a silicon wafer according to claim 10, wherein said trimming means is laser beam means for applying a laser beam.

14. An apparatus for bonding a protection film onto a silicon wafer according to claim 10, wherein said cooling means is cooled air flow injection means for injecting a cooled air flow to said silicon wafer.

The bonding method according to the present invention, which is a method for bonding a protection film onto a silicon wafer using a three-layer film having a reinforcement film and a carrier film provided on front and rear surfaces of a protection film, respectively, exhibits an excellent advantage that it is possible to further improve productivity for an operation for bonding the protection film onto the silicon wafer.

The apparatus according to the present invention can optimally realize the method.

DETAILED DESCRIPTION OF THE INVENTION

Figure 1:
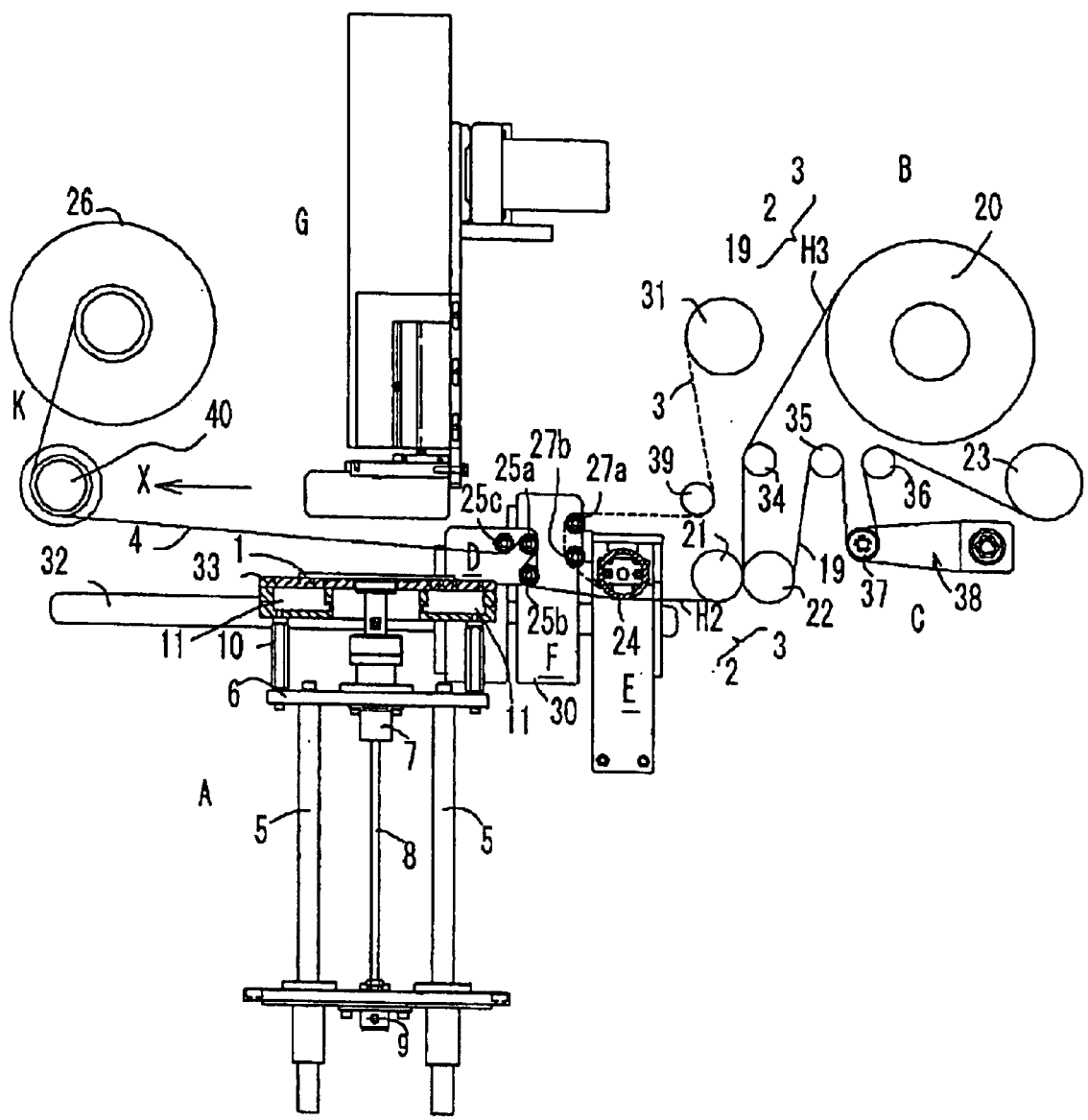
FIG. 1 is a side view of an apparatus according to the present invention.

The invention will now be described in detail.

A method for bonding a protection film onto a silicon wafer according to the present invention is a method for bonding a protection film onto a silicon wafer using a three-layer film formed by providing respectively a reinforcement film and a carrier film on front and rear surfaces of a protection film which protects the silicon wafer. The method is characterized by comprising the steps of: separating the carrier film from the three-layer film to provide a two-layer film; bonding the protection film as the two-layer film onto the front surface of the silicon wafer; peeling off the reinforcement film from the two-layer film bonded onto the front surface of the silicon wafer to leave only the protection film on the front surface of the silicon wafer; and cutting off the protection film along a peripheral edge of the silicon wafer using trimming means.

According to the bonding method of the present invention, the two-layer film having the reinforcement film provided on the protection film is bonded onto the silicon wafer. Due to this, compared with a case where the protection film is solely bonded onto the silicon wafer, it is possible to bond the protection film on to the silicon wafer neatly. In addition, since the reinforcement film is peeled off from the two-layer film bonded onto the silicon wafer and then the remaining protection film is cut off by the trimming means, it is not necessary to peel off one by one the reinforcement film from the protection film. It is possible to improve efficiency for an operation for bonding the protection film onto the silicon wafer.

Further, after cutting off the protection film by the trimming means, a residual cutout film can be collected. As a result, it is possible to further improve efficiency for the operation for bonding the protection film onto the silicon wafer.

Further, after the two-layer film is bonded onto the front surface of the silicon wafer, the two-layer film can be cooled by cooling means and then the reinforcement film can be peeled off from the cooled two-layer film. As a result, it is possible to easily peel off the reinforcement film from the two-layer film.

Moreover, the cooling means can be cooled air flow injection means for injecting a cooled air flow to the silicon wafer. As a result, it is possible to easily cool the two-layer film.

Furthermore, the trimming means can be laser beam means for applying a laser beam. As a result, it is possible to easily cut off the protection film bonded onto the silicon wafer.

An apparatus for bonding a protection film onto a silicon wafer according to the present invention is an apparatus for bonding a protection film onto a silicon wafer using a three-layer film formed by providing respectively a reinforcement film and a carrier film on front and rear surfaces of a protection film which protects the silicon wafer, and characterized by comprising; supply means for supplying the three-layer film to table means on which the silicon wafer is mounted; separation and take-up means for separating and taking up the carrier film from the three-layer film supplied by the supply means; assigning and separation means for inducing the two-layer film obtained by separating the carrier film from the three-layer film onto the silicon wafer; joint means for pushing the two-layer film assigned onto the silicon wafer on the silicon wafer to join the two-layer film onto the silicon wafer; peel-off means for taking up the reinforcement film while peeling off the reinforcement film from the two-layer film joined onto the silicon wafer; trimming means for trimming the protection film obtained by peeling off the reinforcement film from the two-layer film, along a peripheral edge of the silicon wafer; and take-up means for taking up a cutout film remaining after the protection film is trimmed. According to the bonding apparatus of the present invention, the above-stated bonding method can be appropriately realized.

Further, the apparatus can comprise cooling means for cooling the two-layer film joined onto the silicon wafer by the joint means. In addition, the cooling means can be cooled air flow injection means for injecting a cooled air flow to the silicon wafer.

Further, the assigning and separation means, the peel-off means and the joint means can be set to be able to reciprocate in a traveling direction (X) in which the cutout film travels. As a result, it is possible easily peel off the reinforcement film from the two-layer film joined to the silicon wafer.

Moreover, the peel-off means can be arranged between the assigning and separation means and the joint means. As a result, it is possible to easily peel off the reinforcement film from the two-layer film joined to the silicon wafer.

The assigning and separation means (D) can comprise a pair of upper and lower winding rollers (25a and 25b) having a rotation axis in a direction orthogonal to a traveling direction (X) in which the protection film travels when the protection film supplied from the supply means (B) is changed to a cutout film (4) and taken up by the take-up means (K). If the assigning and separation means is moved forward, the lower winding roller out of the upper and lower winding rollers can assign the protection film onto the silicon wafer. If the assigning and separation means is moved backward, the upper winding roller can peel off the cutout film (4) from the silicon wafer.

Furthermore, the peel-off means (F) can comprise upper and lower winding rollers (27a and 27b) having a rotation axis in a direction orthogonal to the traveling direction (X) in which the protection film travels when the protection film (2) supplied from the supply means (B) is changed to the cutout film (4) and taken up by the take-up means (K). The lower winding roller (27b) can be mounted above the joint roller (24) of the joint means (E). In addition, the joint roller (24) can serve as a joint and a separation fulcrum for joining the protection film onto the silicon wafer (1) while pushing the two-layer film (H2) against the silicon wafer (1) side when the joint means (E) is moved forward and for separating the reinforcement film from the protection film when the joint means (E) is moved backward.

Moreover, the protection film can be, for example, thermo-sensitive adhesive and/or photosensitive. Further, the protection film can be exemplified by a resin film, a polyimide film or the like.

DESCRIPTION OF THE PREFERRED EMBODIMENT

The present invention will be descried more concretely with reference to the drawings.

As shown in FIG. 1, an apparatus according to the present invention is provided with a table means A which supports from below a table 33, on which a silicon wafer 1 is mounted, a pair of supply means B and a take-up means K for making a strip protection film 2 cross approximately horizontally slightly above the table 33. The protection film 2 is fed out from the supply means B, changed to a cutout film 4 on the table means A and taken up by the take-up means K. Therefore, a direction which connects the supply means B, the table means A and the take-up means K corresponds to the traveling direction X of the protection film 2 on the same vertical plane.

Further, in the apparatus according to the present invention, the protection film 2 is fed out, as a three-layer film H3 on which a reinforcement film 3 and a carrier film 19 are provided respectively on the front and rear surfaces of the protection film 2, toward the take-up means K. A separation and take-up means C which separates the carrier film 19 from the three-layer film H3 and takes up the resultant film is provided. In addition, an assigning and separation means D which assigns the protection film 2 onto the silicon wafer 1 and separates the cutout film 4 which remains after trimming the protection film 2 joined to the silicon wafer 1, a peel-off means F which peels off the reinforcement film 3 which is provided on the protection film 2, a joint means E which joins a two-layer film H2 which consists of the protection film 2 and the reinforcement film 3 to the silicon wafer 1, and a trimming means G which forms a predetermined cut into the protection film 2 joined to the silicon wafer 1 and trims the resultant protection film 2, are provided.

The table means A consists of a plurality of vertically movable slide rods 5, a substrate 6 which is attached to the tip end portions of the slide rods 5, a support section 7 which is provided in the central portion of the substrate 6, an intake pipe 8 which is vertically attached to the support section 7, a pipe joint 9 which is provided integrally with the proximal end portion of the intake pipe 8, and a plurality of uniform pressure chambers 11 which are provided on the peripheral edge of the substrate 6 through a base 10. The tip end face of the intake pipe 8 penetrates the central portion of the table 33 to vacuum-chuck the silicon wafer 1. Accordingly, in the table means A, if the slide rods 5 are expanded by an expansion means such as an air cylinder provided on a frame, not shown, the table 33 is made vertically movable. If the internal pressure of the intake pipe 8 is reduced by a pressure reducing device, such as a vacuum tank or an intake pump, not shown, the silicon wafer 1 is vacuum-chucked onto the table 33.

Figure 2:
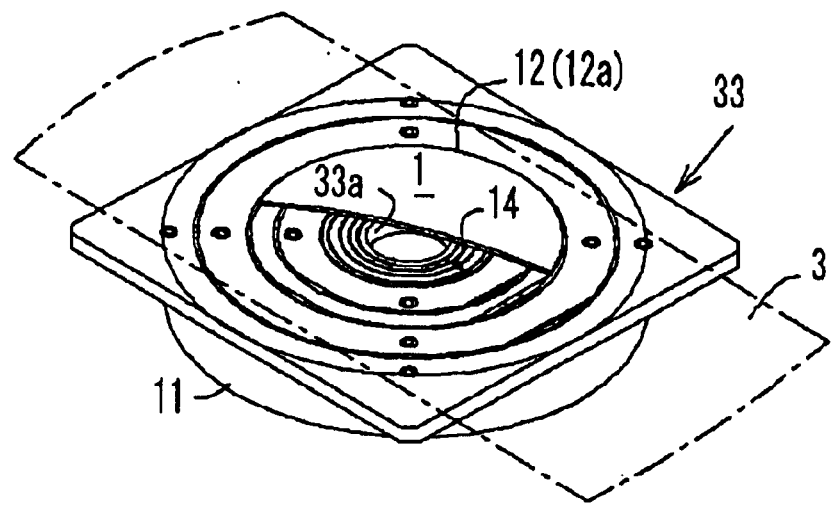
FIG. 2 is a broken-out perspective view of a table which is disposed on the apparatus.
Figure 3:
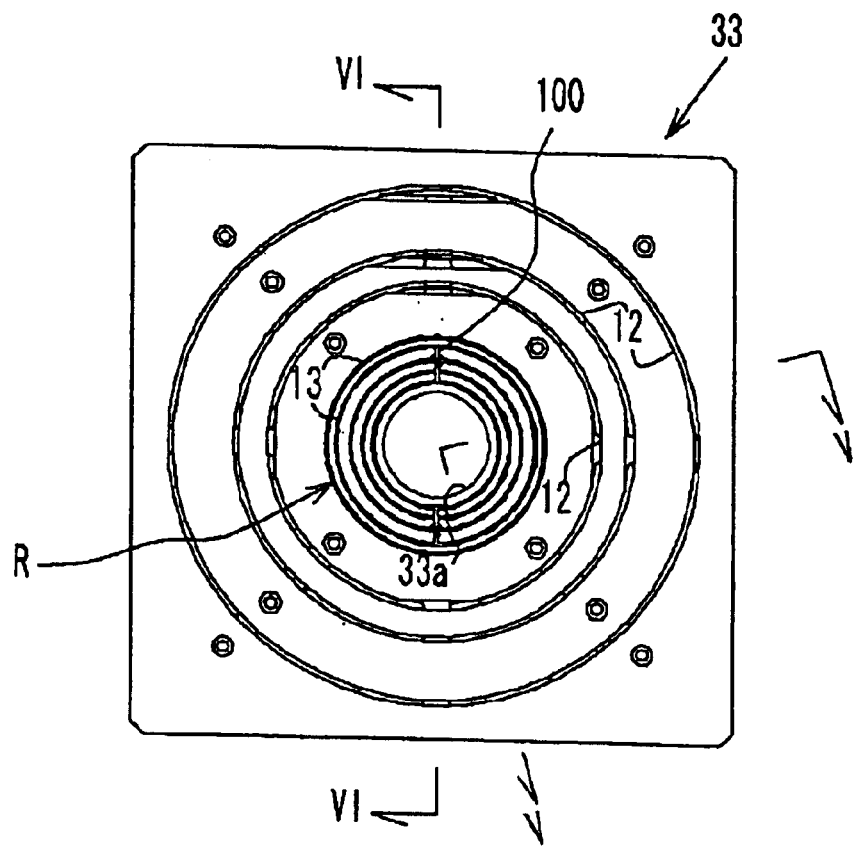
FIG. 3 is a top view of the table.
Figure 4:
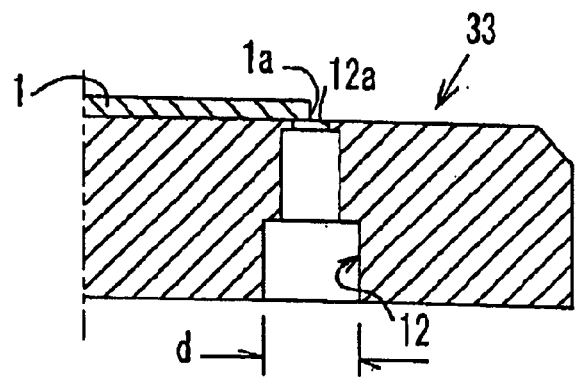
FIG. 4 is a partial longitudinal sectional view of the table.

As shown in FIGS. 2 and 3, the table 33 is a plate member which has square upper and lower surfaces and has a hole section 33a provided in a central portion for causing the tip end portion of the intake pipe 8 to penetrate the central portion thereof. A plurality of annular slits 12 having different radii are concentrically formed on the upper surface of the table 33. If the silicon wafers 1 having various radii are mounted on the table 33, the outer peripheral surface 1a of each silicon wafer 1 faces the opening 12a of one of the plural annular slits 12 as shown in FIG. 4.

Figure 5:
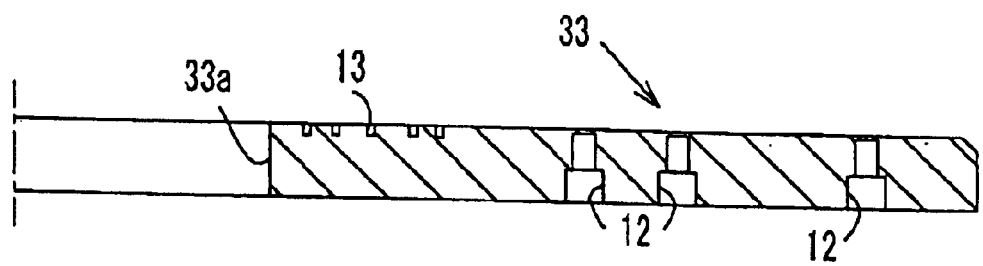
FIG. 5 is a cross-sectional view taken along line V—V of FIG. 3.
Figure 6:
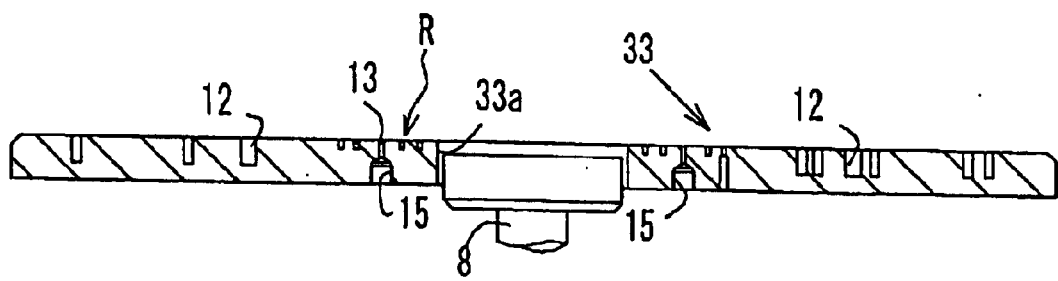
FIG. 6 is a cross-sectional view taken along line VI—VI of FIG. 3.

As shown in FIGS. 2, 3 and 5, a plurality of annular grooves 13 are concentrically arranged near the hole section 33a on the upper surface of the table 33. These annular grooves 13 communicate with one another through a communication path 100 (see FIG. 3). In addition, as shown in FIG. 6, a plurality of injection holes 15 communicate with a part of these annular grooves 13 from below. Further, the respective injection holes 15 are connected to a compressed air source (not shown) which supplies compressed air. Just before the protection film 3 is cut off by the laser beam means G, the air is injected from the annular grooves 13 through the injection holes 15 to cool the silicon wafer 1 so as to facilitate peeling off the reinforcement film 4 from the two-layer film H2. In this embodiment, it may be said that the compressed air source, the injection holes 15, the communication path 100, the annular grooves 13 and the like constitute "cooling means R" or, to be specific, "a cooling air flow injection means" according to the present invention.

Figure 7:
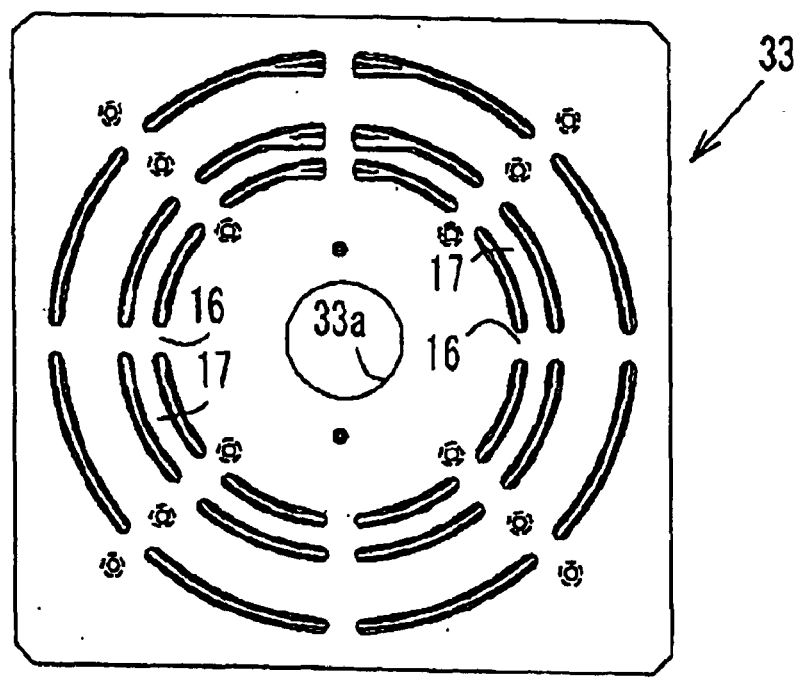
FIG. 7 is a bottom view of the table.
Figure 8:
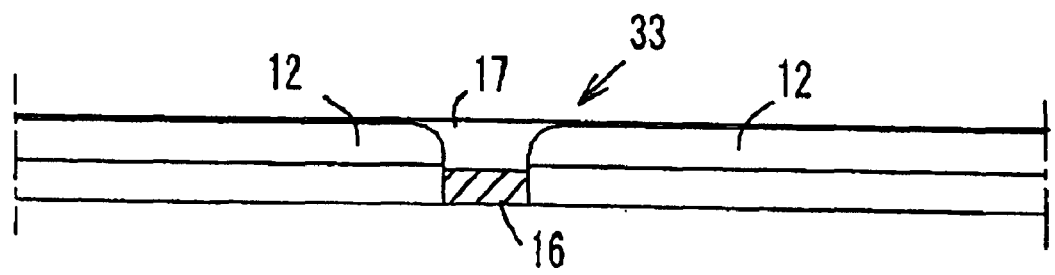
FIG. 8 is a side sectional view of the table which shows that a part of an annular slit is developed.
Figure 9:
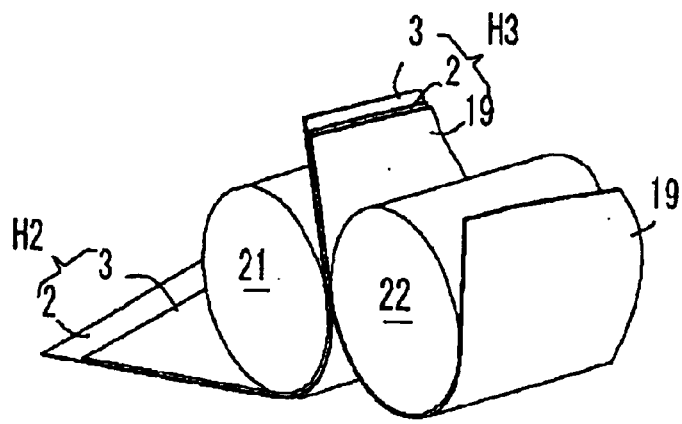
FIG. 9 is a perspective view of pinch rollers of the apparatus.

As shown in FIGS. 7 and 8, bridging sections 16 which bridge the lower portions of the annular slits 12 are formed in portions of the annular slits 12 near the lower surface of the table 33 at predetermined intervals, so as to hold the boundary sections 17 between the plurality of annular slits 12 which differ in radius of curvature. The radial opening widths of the annular slits 12 are made smaller in upper portions. Preferably, as shown in FIG. 4, the opening width d is made smaller upward by steps.

As shown in FIGS. 1, 2 and 7, a plurality of, preferably four uniform pressure chambers 11 are provided on the lower surface of the table 33 and flexible intake pipes (not shown) are extended from the bottoms (or sidewalls) of the chambers 11 toward the pressure reducing device. Since the upper end face of each uniform pressure chamber 11 is closed by the table 33 to be substantially made airtight, the internal pressure of each uniform pressure chamber 11 is spread to the annular slits 12 formed in the table 33. Due to this, if the pressure reducing device is driven, the pressure of the intake pipes 8, the uniform pressure chambers 11 and the annular slits 12 is reduced. As a result, the air in an atmosphere of the upper portion of the openings 12a of the annular slits 12 is sucked from the openings 12a.

Next, the supply means B will be described. As shown in FIG. 1, the supply means B consists of a supply drum 20 around which the three-layer film H3 consisting of the reinforcement film 3 of polyethylene, polypropylene or the like, the protection film 2 and a carrier film 19 of polyethylene terephthalate is wound, a pair of pinch rollers 21 and 22 for drawing the three-layer film H3 from the supply drum 20, and a guide roller 34 which is provided between the supply drum 20 and the paired pinch rollers 21, 22. The three-layer film H3 which passes through the pinch rollers 21 and 22 is separated into a two-layer film H2 which consists of the protection film 2 and the reinforcement film 3, and the carrier film 19. The pinch rollers 21 and 22 and the guide roller 34 are disposed so that their respective rotation axes (not shown) are orthogonal to the traveling direction X (various rollers to be described hereafter are disposed similarly).

As shown in FIG. 1, the separation and take-up means C consists of a take-up drum 23 which takes up the carrier film 19 separated from the three-layer film H3, a pair of turn rollers 35 and 36 which are provided between the take-up drum 23 and the pinch rollers 21, 22 at predetermined intervals, a tension adjusting device 38 which has a dancer roller 37 provided on a tip end portion thereof for pushing the carrier film 19 from above between the turn rollers 35 and 36. Since an elastic member which suppresses the rising force of the dancer roller 37 as the dancer roller 37 rises is included in the tension adjusting device 38, the carrier film 19 is taken up by the take-up drum 23 with a predetermined tension.

On the other hand, the two-layer film H2 which passes trough the pinch rollers 21 and 22 is directly supplied to the joint means E. This joint means E is guided by a slide shaft 32 extending toward the traveling direction X to be able to reciprocate in the direction X. The joint means E is provided with a joint roller 24 which has a lowermost peripheral region located almost at the same height position as that of the upper surface of the silicon wafer 1 mounted on the table 33. The two-layer film H2 is slightly wound around the joint roller 24, and then separated into the protection film 2 and the reinforcement film 3. The protection film 2 is directly induced by the assigning and separation means D almost horizontally, whereas the reinforcement film 3 is taken by the peel-off means F located at a slightly higher position than that of the assigning and separation means D. As a result, after being wound around the joint roller 24, the protection film 2 and the reinforcement film 3 are temporarily separated from each other. In this context, the joint roller 24 serves as a separation fulcrum for separating the reinforcement film 3 from the protection film 2.

The peel-off means F consists of a head section 30 which is guided by the slide shaft 32 extending in the traveling direction X to be able to reciprocate in the direction X and provided to be adjacent to the joint means E, a pair of upper and lower winding rollers 27a and 27b which are provided above the head section 30, a take-up roller 31 which takes up the reinforcement film 3 wound around the rollers 27a and 27b, and a turn roller 39 which is provided between the upper and lower winding rollers 27a, 27b and the take-up roller 31. Since the lower winding roller 27b is provided at a slightly higher position than that of the joint roller 24, the lower winding roller 27b exhibits a function of separating the reinforcement film 3 from the two-layer film H2 wound around the joint roller 24.

The assigning and separation means D is provided to be adjacent to the peel-off means F and guided by the slide shaft 32 to be able to reciprocate in the X direction. This assigning and separation means D is provided with a pair of upper and lower winding rollers 25a and 25b and a front winding roller 25c at the same level as that of the upper winding roller 25a. The lowermost region of the peripheral surface of the lower winding roller 25b is set to be almost at the same height position as that of the upper surface of the silicon wafer 1 mounted on the table 33 of the table means A. If the assigning and separation means D is moved forward together with the joint means E (from the right to left of FIG. 1), the protection film 2 which is spread between the lower winding roller 25b and the joint roller 24 is moved onto the silicon wafer 1 and assigned to cover the silicon wafer 1. Conversely, if the assigning and separation means D is moved backward, the cutout film 4 is peeled off from the silicon wafer 1.

If the protection film 2 is assigned onto the silicon wafer 1, the joint roller 24 of the joint means E which moves after the means D joins the reinforcement film 3 onto the protection film 2 into the two-layer film H2 and pushes the resultant two-layer film H2 against the silicon wafer 1 to thereby join the two-layer film H2 to the silicon wafer 1.

Figure 10:
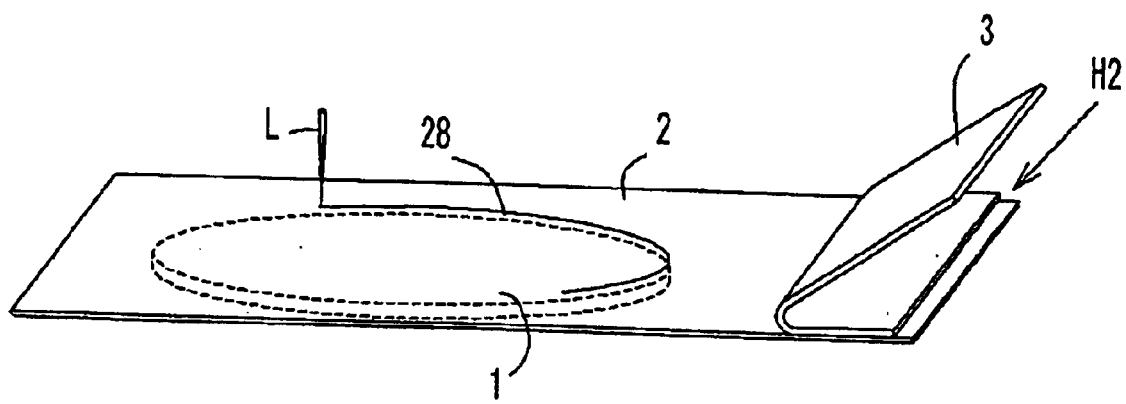
FIG. 10 is a perspective view showing a state in which a cut is formed into a protection film.

Furthermore, the apparatus according to the present invention is provided with the trimming means or, to be specific, the laser beam means G above the silicon wafer 1. As shown in FIG. 1, if the strip protection film 2 is joined to the surface of the silicon wafer 1, the laser beam means G is driven to form a cut 28 into the protection film 2 as shown in FIG. 10. At this time, the laser beam means G moves by the control of computer horizontally along the peripheral edge of the silicon wafer.

Figure 11:
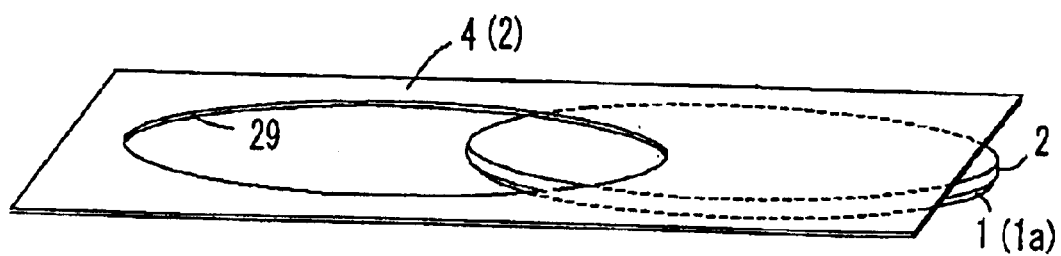
FIG. 11 is a perspective view showing a state in which the protection film has been trimmed.
Figure 12:
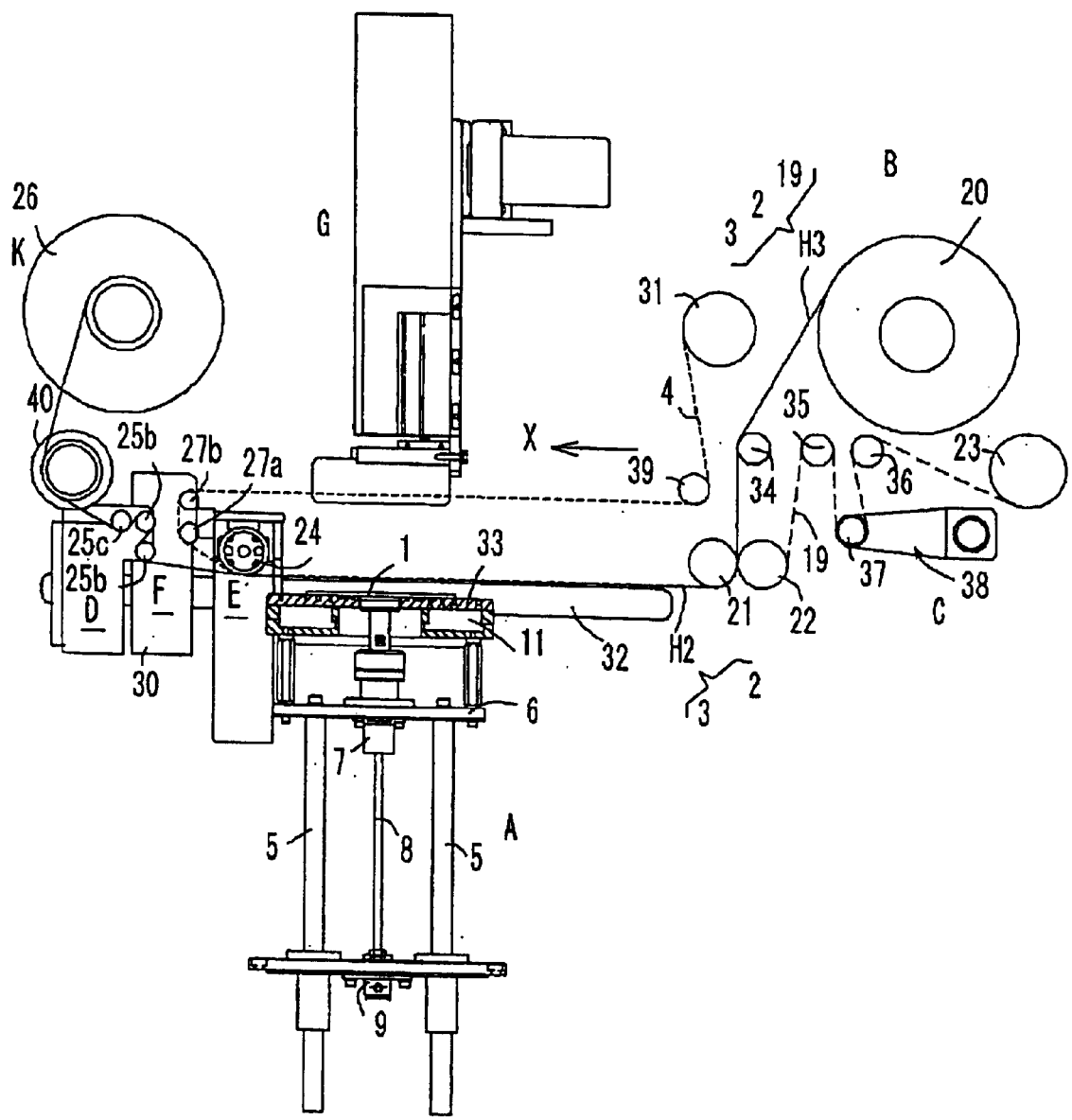
FIG. 12 is a side view showing a state in which an assigning and separation means, a joint means and a peel-off means of the apparatus according to the present invention are moved.

If the annular cut 28 is formed into the protection film 2, the strip protection film 2 changes to a cutout film 4 which has a to-be-cut-out section 29 almost equal in size to the outer shape of the silicon wafer 1 as shown in FIG. 11. At this time, the take-up means K is actuated to take up the wound film 4. The take-up means K consists of a take-up drum 26 rotated by a driving source and a turn roller 40 provided between the take-up drum 26 and the front winding roller 25c. If the winding means K is to be actuated, the joint means E, the peel-off means F and the assigning and separation means D are moved backward.

A method according to the present invention will next be described. As shown in FIG. 1, the joint means E, the peel-off means F and the assigning and separation means D are arranged and the three-layer film H3 is fed out while stopping the joint means E, the peel-off means F and the assigning and separation means D. The paired pinch rollers 21 and 22 are slightly rotated to put the three-layer film H3 between the paired pinch rollers 21 and 22, and the carrier film 19 is separated from the three-layer film H3 to be able to be taken up by the separation and take-up means C. Next, the two-layer film H2 is wound around the joint roller 24 and separated into the protection film 2 and the reinforcement film 3. The protection film 2 is extended toward the take-up means K through the assigning and separation means D so that the take-up means K can take up the protection film 2. The reinforcement film 3 is wound around the upper and lower winding rollers 27a and 27b so that the take-up roller 31 can take up the reinforcement film 3.

If the apparatus according to the present invention has been set operable as stated above, the silicon wafer 1 is preheated and mounted on the table 33 of the table means A. As shown in FIG. 11, the assigning and separation means D, the peel-off means F and the joint means E are moved forward. If so, during this movement, the lower winding roller 25b of the assigning and separation means D assigns the protection film 2 onto the silicon wafer 1. Thereafter, while the joint roller 24 of the joint means E pushes the reinforcement film 3 on the protection film 2 to form the two-layer film H2 again, the two-layer film H2 is press-fitted onto the silicon wafer 1. As a result, the protection film 2 which is the lower layer of the two-layer film H2 is joined to the silicon wafer 1. During this time, the protection film is in indirect contact with the joint roller 24 while the reinforcement film 3 is layered thereon, so that the reinforcement film 3 reinforces insufficient physical properties. Consequently, even the protection film 2 which is made quite thin (e.g., 15 μm) can be appropriately used.

Figure 13:
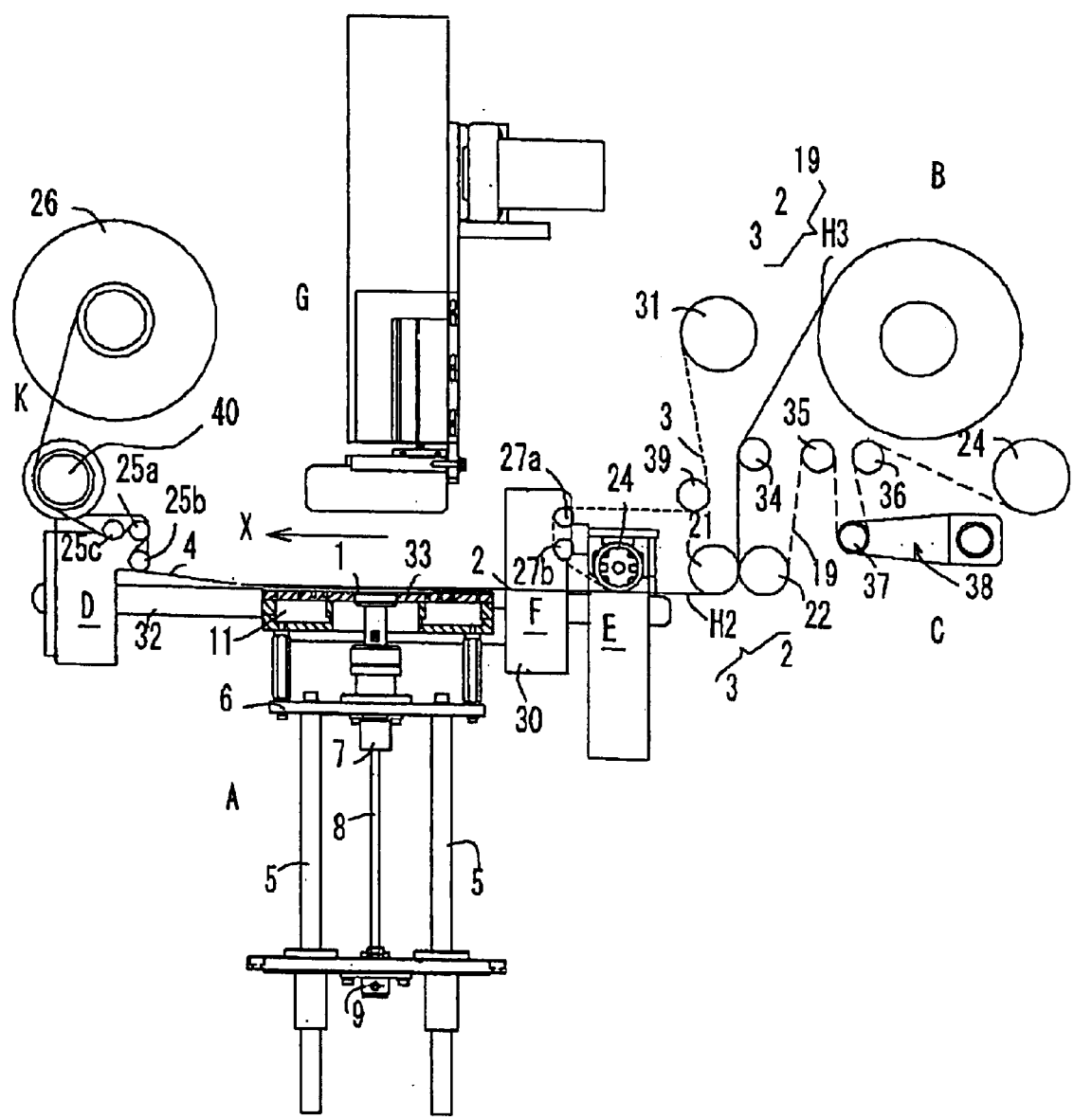
FIG. 13 is a side view showing a state in which the joint means and the peel-off means of the apparatus according to the present invention have returned to their original positions.
Figure 14:
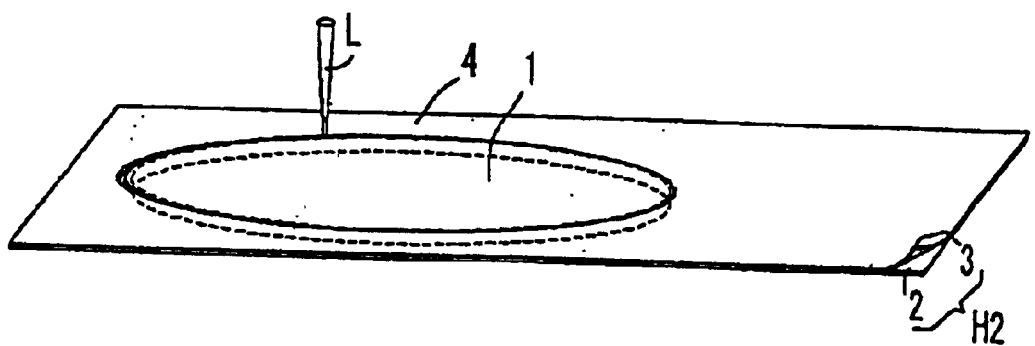
FIG. 14 is a perspective view of important parts showing a conventional protection film trimming step.
Figure 15:
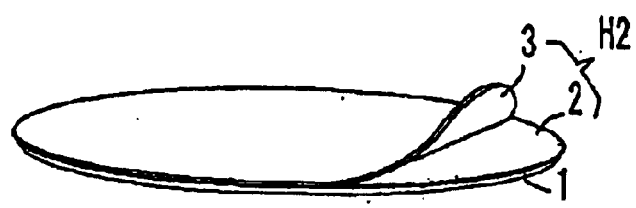
FIG. 15 is a perspective view showing a state in which a protection film and a reinforcement film have been joined to the upper surface according to the conventional art.
Figure 16:
FIG. 16 is a perspective view showing a state in which the protection film has been joined to the upper surface according to the conventional art.

Thereafter, the air is injected toward the rear surface of the silicon wafer 1 from the annular grooves 13 through the injection holes 15 to thereby cool this silicon wafer 1 and the two-layer film H2. Next, while the two-layer film H2 is sufficiently cooled, the peel-off means F and the joint means E are moved backward as shown in FIG. 13. If so, the upper and lower winding rollers 27a and 27b of the peel-off means F are also moved backward. Therefore, the reinforcement film 3 wound around the lower winding roller 27b which is disposed at a higher position than that of the joint roller 24 is peeled off from the protection film 2 and only the protection film 2 remains on the silicon wafer 1.

The pressure reducing device of the table means A is driven to reduce the pressure of the uniform pressure chambers 11. If so, the external air near the outer peripheral portion of the silicon wafer 1 mounted on the table 33 is sucked and the protection film 2 on the silicon wafer 1 is cooled by the intake flow. In this state, as shown in FIG. 10, if the laser beam means G is driven to apply a laser beam L to the protection film 2 to form the cut 28 into the protection film 2 and the beam gun (not shown) of the laser beam means G is moved along the peripheral surface 1a of the silicon wafer 1, then the protection film 2 is trimmed. The residual cutout film 4 of the protection film 2 which is not joined to the silicon wafer 1 has a circular to-be-cut-out section 29 in the central portion thereof in a width direction and becomes a strip film which is continuous in both side edges.

In this way, if the protection film 2 has been bonded onto the upper surface of the silicon wafer 1, the assigning and separation means D is moved backward to return to its original position as shown in FIG. 1. Then, the upper and lower winding rollers 25a and 25b of the separation means D lift the cutout film 4 to be located above the silicon wafer 1. Thereafter, if the supply means B, the separation and winding means C, the assigning and separation means D, the joint means E, the peel-off means F and the take-up means K are driven to feed the protection film 2 by a length slightly larger than the diameter of the silicon wafer 1, i.e., feed the protection film 2 frame by frame, then one cycle of the method for bonding the protection film onto the silicon wafer according to the present invention is completed and, unlike the conventional art, an operation for peeling off the reinforcement film 3 from the protection film bonded onto the silicon wafer can be dispensed with. Further, since the cutout film 4 can be taken up and collected while being separated from the reinforcement film 3, it is possible to reduce resource recycling load.

The present invention is not limited to the concrete embodiment described about but applicable to other embodiments modified variously within the scope of the present invention depending on purposes. That is, the present invention is also applicable to an embodiment in which the protection film is temporarily bonded to the rear surface of the silicon wafer 1. In addition, as long as the positions at which the joint roller 24, and the upper and lower winding rollers 27a and 27b are kept to hold a predetermined relationship, it is possible to provide the joint means E and the head section 30 of the peel-off means integrally with each other.

What is claimed is:

1. A method for bonding a protection film onto a silicon wafer using a three-layer film formed by providing a reinforcement film and a carrier film on a front surface and a rear surface of said protection film, respectively, said method comprising the steps of:

separating said carrier film from said three-layer film to provide a two-layer film;

bonding said protection film onto a front surface of said silicon wafer as said two-layer film;

peeling off said reinforcement film from said two-layer film bonded onto said front surface of said silicon wafer to leave only said protection film on said front surface of said silicon wafer; and thereafter cutting off said protection film along a peripheral edge of said silicon wafer that has only said protection film therein using trimming means.

2. A method for bonding a protection film onto a silicon wafer according to claim 1, wherein after cutting off said protection film by said trimming means, a residual cutout film is collected.

3. A method for bonding a protection film onto a silicon wafer according to claim 1, wherein after said two-layer film is bonded onto said front surface of said silicon wafer, said two-layer film is cooled by cooling means and then said reinforcement film is peeled off from said two-layer film.

4. A method for bonding a protection film onto a silicon wafer according to claim 3, wherein said cooling means is cooled air flow injection means for injecting a cooled air flow to said silicon wafer.

5. A method for bonding a protection film onto a silicon wafer according to claim 1, wherein said trimming means is laser beam means for applying a laser beam.

6. An apparatus for bonding a protection film onto a silicon wafer using a three-layer film formed by providing a reinforcement film and a carrier film on a front surface and rear surface of said protection film, respectively, said apparatus comprising:

supply means for supplying said three-layer film to table means for supplying said three-layer film to table means on which said silicon wafer is mounted;

separation and take-up means for separating and taking up said carrier film from said three-layer film supplied by said supply means;

assigning and separation means for inducing a two-layer film obtained by separating said carrier film from said three-layer film onto said silicon wafer, and assigning said two-layer film onto said silicon wafer;

joint means for pushing said two-layer film assigned onto said silicon wafer on said silicon wafer, and joining said two-layer film onto said silicon wafer;

peel-off means for taking up said reinforcement film while peeling off said reinforcement film from said two-layer film joined onto said silicon wafer;

trimming means for trimming said protection film obtained by peeling off said reinforcement film from said two-layer film along a peripheral edge of said silicon wafer; and take-up means for taking up a cutout film remaining after said protection film is trimmed.

7. An apparatus for bonding a protection film onto a silicon wafer according to claim 6, wherein said assigning and separation means, said peel-off means and said joint means are set to be able to reciprocate in a traveling direction (X) in which said cutout film travels.

8. An apparatus for bonding a protection film onto a silicon wafer according to claim 6, wherein said peel-off means arranged between said assigning and separation means and said joint means.

9. A method for bonding a protection film onto a silicon wafer according to claim 6, wherein said trimming means is laser beam means for applying a laser beam.

10. An apparatus for bonding a protection film onto a silicon wafer according to claim 6, wherein comprising cooling means for cooling said two-layer film joined onto said silicon wafer by said joint means.

11. An apparatus for bonding a protection film onto a silicon wafer according to claim 10, wherein said assigning and separation means, said peel-off means and said joint means are set to be able to reciprocate in a traveling direction (X) in which said cutout film travels.

12. An apparatus for bonding a protection film onto a silicon wafer according to claim 10, wherein said peel-off means is arranged between said assigning and separation means and said joint means.

13. An apparatus for bonding a protection film onto a silicon wafer according to claim 10, wherein said trimming means is laser beam means for applying a laser beam.

14. An apparatus for bonding a protection film onto a silicon wafer according to claim 10, wherein said cooling means is cooled air flow injection means for injecting a cooled air flow to said silicon wafer.

* * * * *